US006556004B2

(12) United States Patent
Okuno et al.

(10) Patent No.: US 6,556,004 B2
(45) Date of Patent: Apr. 29, 2003

(54) SUPPORTING FRAMEWORK FOR DISPLAY PANEL OR PROBE BLOCK

(75) Inventors: Toshio Okuno, Kanagawa-ken (JP); Gunji Mizutani, Tokyo (JP); Masatomo Nagashima, Kanagawa-ken (JP)

(73) Assignees: Soshotech Co., Ltd., Kanagawa-ken (JP); Adtec Engineering Co., Ltd., Tokyo (JP)

(*) Notice: Subject to any disclaimer, the term of this patent is extended or adjusted under 35 U.S.C. 154(b) by 0 days.

(21) Appl. No.: 09/949,976

(22) Filed: Sep. 12, 2001

(65) Prior Publication Data

US 2002/0030149 A1 Mar. 14, 2002

(30) Foreign Application Priority Data

Sep. 12, 2000 (JP) ....................................... 2000-276573

(51) Int. Cl.[7] ................................................ G01R 31/02

(52) U.S. Cl. ...................... 324/158.1; 269/55; 324/73.1

(58) Field of Search ............................ 324/73.1, 158.1, 324/754; 269/55, 56, 57, 60, 74, 81, 91, 240, 244; 144/137, 144.1, 371; 74/815, 817; 409/165, 175, 221, 226

(56) References Cited

U.S. PATENT DOCUMENTS 4,648,585 A * 3/1987 Yang .......................... 369/104
5,801,527 A * 9/1998 Takao ...................... 324/158.1
6,003,571 A * 12/1999 Broussard ................... 144/154

* cited by examiner

*Primary Examiner*—Kamand Cuneo
*Assistant Examiner*—Trung Nguyen
(74) *Attorney, Agent, or Firm*—Wenderoth, Lind & Ponack, L.L.P.

(57) ABSTRACT

A supporting framework for a display panel or a probe block is capable of properly coping with display panels of different sizes in a testing apparatus. By moving a framework 1 with a display panel supported thereon or by moving frame members 2, 3, 4, 5 of the framework 1 with a probe block supported thereon, an opening (or space) defined by the respective frame members can be enlarged or reduced.

4 Claims, 7 Drawing Sheets

SUPPORTING FRAMEWORK FOR DISPLAY PANEL OR PROBE BLOCK

BACKGROUND OF THE INVENTION

1. Field of the Invention

This invention relates to an improvement of a supporting framework for a display panel as an object to be tested, or a probe block used for testing. Especially, the present invention has been developed chiefly aiming at a supporting framework for a display panel as represented by a plasma display panel (PDP), etc., or a supporting framework for a probe block used for testing, which is press contacted with electrode pads arranged on a peripheral edge portion of the display panel.

2. Related Art

The supporting framework for a display panel and the supporting framework for a probe block for testing are each formed of a square framework. As shown in FIGS. 13 and 14, a front supporting framework with a display panel B for testing supported thereon is arranged on a front side of a rear supporting framework with a display panel P as represented by a liquid crystal display panel thereon. The rear supporting framework is movable towards and away from the front supporting framework. By movement of the rear supporting framework towards the front supporting framework, testing terminals 13 of the testing probe block B are press contacted with corresponding electrode pads 12 arranged on a peripheral edge of the display panel P. By moving the rear supporting framework away from the front supporting framework and then moving the rear supporting framework sideways, the display panel P can be changed.

Conventionally, a specific rear supporting framework is prepared for each display panel having a different size and a specific front supporting framework is, likewise, prepared in accordance with the display panel P having a different size, so that the testing probe block B is supported thereon.

Therefore, for every display panel P having a different size , it is necessary to install a testing apparatus equipped with a front and a rear supporting framework capable of properly coping with the display panel P. Otherwise, it is necessary to design only the front and rear supporting frameworks to have a compatible construction so that they can be changed in accordance with the size of the display panel P. Thus, a large amount of money is required for preparing and installing such equipment. Moreover, the working load for changing the heavy frameworks is increased. In addition, the working efficiency for testing is lowered.

SUMMARY OF THE INVENTION

The present invention is accomplished in order to solve the abovementioned problems.

Therefore, a first problem to be solved by the present invention is to easily form a supporting framework which can properly cope with various kinds of display panels each having a different size, to likewise easily form a probe block used for testing, which can properly cope with the size of the display panel, and to make only one testing apparatus properly cope with various kinds of display panels each having a different size.

A second problem to be solved by the present invention is to reasonably constitute an enlargeable/reducible supporting framework as a supporting framework for a display panel or a supporting framework for a probe block, which can be enlarged/reduced by a limited driving source.

In order to solve the above problems, a first aspect of the present invention constitutes a square supporting framework for a display panel as an object to be tested or a probe block used for testing, in the following manner.

Firstly, one side section of the square framework is designed to be a fixed frame member.

Secondly, there is provided a Y axis driving frame member which constitutes another one side section disposed adjacent to one side of the fixed frame member and which can drive in a direction (Y axis direction) along the fixed frame member.

Thirdly, there is provided a Y axis driven X axis driving frame member which constitutes another one side section disposed opposite the fixed frame member which can be driven in the Y axis direction by the Y axis driving frame member and which can drive in a direction (X axis direction) towards and away from the fixed frame member.

Fourthly, there is provided an X axis driven frame member which constitutes still another one side section disposed adjacent to the other side of the fixed frame member and which can be driven in the X axis direction by the Y axis driven X axis driving frame member.

Fifthly, a window defined by the four side section frame members is enlarged or reduced by Y axis driving of the Y axis driving frame member and by X axis driving of the Y axis driven X axis driving frame member.

Sixthly, a probe block to be press contacted with the display panel or an electrode pad arranged on the display panel is supported on the frame members defining the enlarged or reduced window.

In order to solve the above problems, a second aspect of the present invention constitutes a square supporting framework for a display panel as an object to be tested or a probe block used for testing in the following manner.

Firstly, a frame member constituting one side section of the square framework is designed to be an X axis driving frame member which can drive in a direction (X axis direction) orthogonal to the one side section.

Secondly, there is provided an X axis driven Y axis driving frame member which constitutes another one side section disposed adjacent to one side of the X axis driving frame member, which can be driven in the X axis direction by the X axis driving frame member and which can drive in a direction (Y axis direction) along the X axis driving frame member.

Thirdly, there is provided a Y axis driven X axis driving frame member which constitutes another one side section disposed opposite the X axis driving frame member, which can be driven in the Y axis direction by the X axis driven Y axis driving frame member and which can drive in the X axis direction.

Fourthly, there is provided an X axis driven frame member which constitutes still another one side section disposed adjacent to the other side of the X axis driving frame member and which can be driven in the X axis direction by the Y axis driven X axis driving frame member.

Fifthly, a window defined by the four side section frame members is enlarged or reduced by Y axis driving of the X axis driven Y axis driving frame member and by X axis driving of the X axis driving frame member and the Y axis driven X axis driving frame member.

Sixthly, a probe block to be press contacted with the display panel or an electrode pad arranged on the display panel is supported on the frame members defining the enlarged or reduced window.

The respective frame members are mutually connected such that they can perform the prescribed X axis movement and/or Y axis movement through a slide rail.

DETAILED DESCRIPTION OF THE EMBODIMENTS

Figure 1:
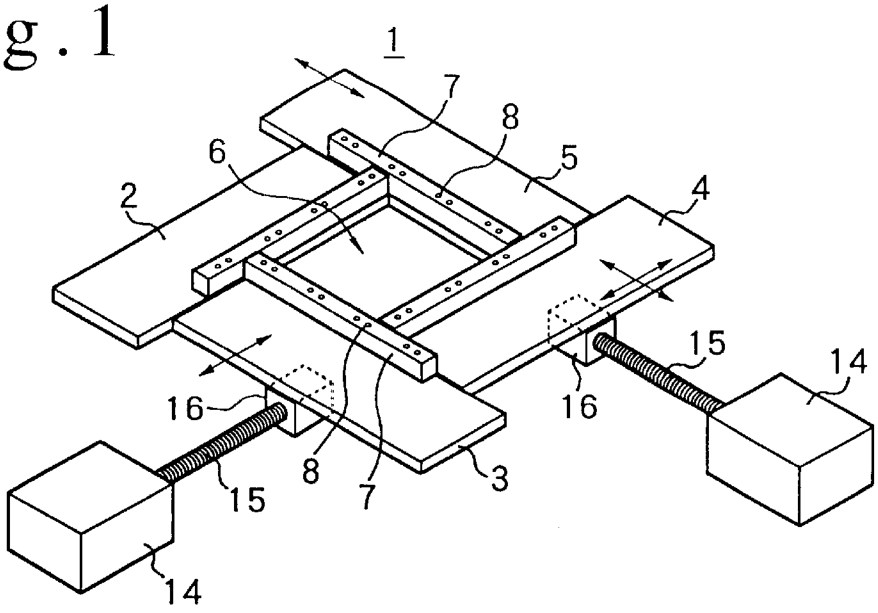
FIG. 1 is a perspective view of a supporting framework for a display panel or probe block showing one embodiment of a first aspect of the present invention.
Figure 2:
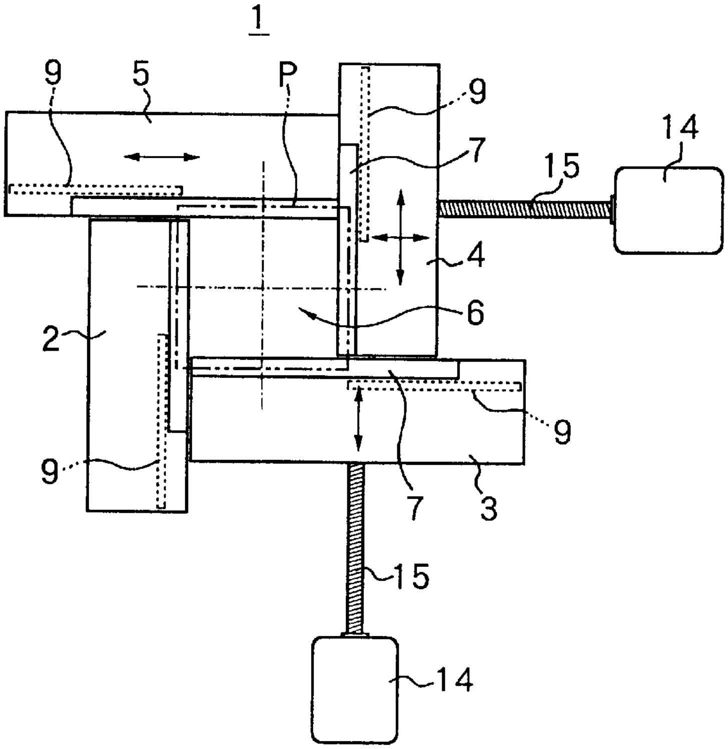
FIG. 2 is a plan view showing a reduced size position of the above supporting framework but with a display panel supported on it.
Figure 3:
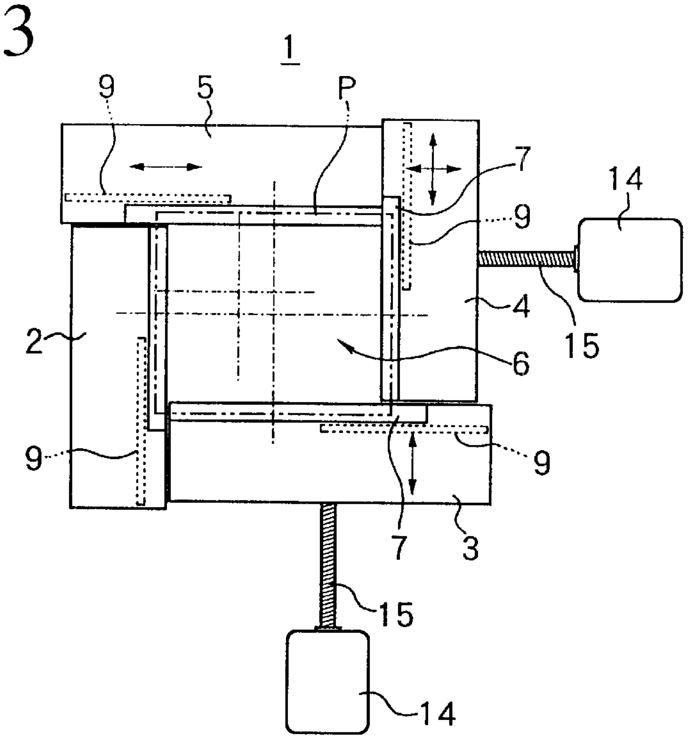
FIG. 3 is likewise a plan view showing an enlarged size position of the supporting framework with a display panel supported on it.
Figure 4:
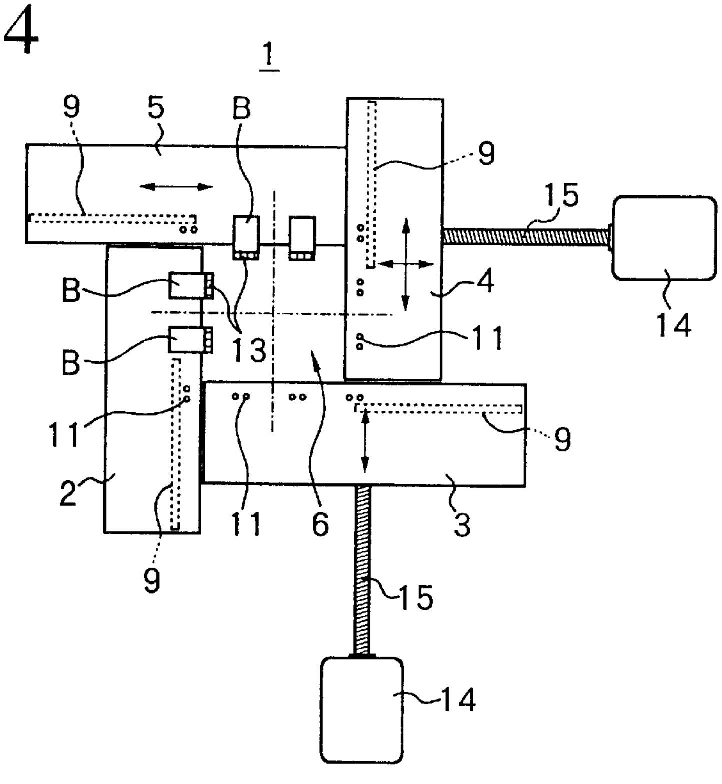
FIG. 4 is a plan view showing a reduced size position of the supporting framework but with a probe block supported on it.
Figure 5:
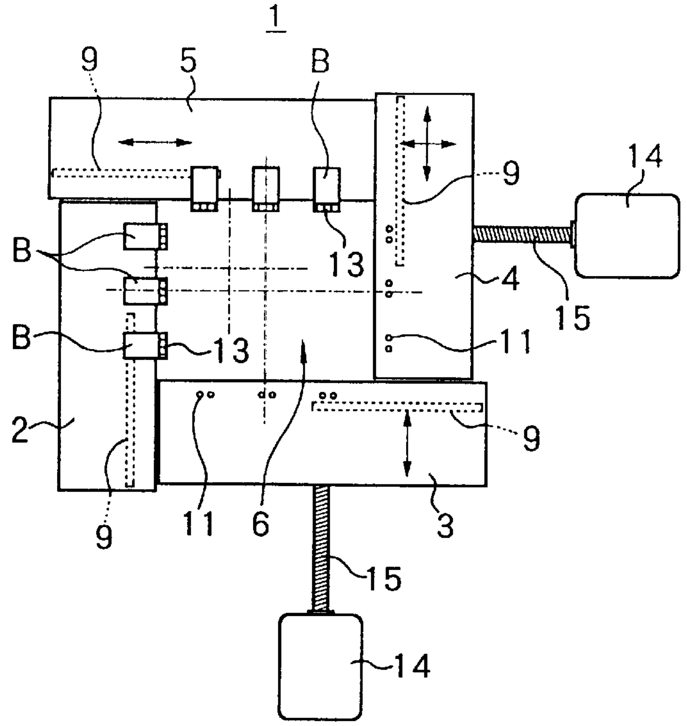
FIG. 5 is likewise a plan view showing an enlarged size position of the supporting framework but with a probe block supported on it.

Embodiments of the present invention will now be described with reference to FIGS. 1 to 14 of the accompanying drawings. In those FIGURES, reference numeral 1 denotes a square supporting framework for supporting a display panel P as represented by a liquid crystal display panel which is an object to be tested.

One side section of the square supporting framework 1 is a fixed frame member 2. In the illustrated embodiments, a left vertical frame member is the fixed frame member 2. Another one side section adjacent the left vertical frame member, i.e., fixed frame member 2 is a Y axis driving frame member 3 which can drive in a direction (Y axis direction, i.e., vertical direction of FIGS. 2 and 3) along the one side section constituted by the fixed frame member 2. In the illustrated embodiments, a lower lateral frame member is the Y axis driving frame member 3.

A Y axis driving mechanism of the Y axis driving frame member 3 comprises a first motor 14, a ball screw 15 rotated by the first motor 14 and a nut 16 attached to the frame member 3 and adapted to convert the force of rotation of the ball screw 15 into a driving force in the Y axis direction. The Y axis driving frame member 3 moves in the Y axis direction within a region where the fixed frame member 2 extends.

Another one side section opposite the fixed frame member 3 is a Y axis driven X axis driving frame member 4 which can be driven in the Y axis direction by the lower lateral frame member and which can drive in a direction (X axis direction) towards and away from the fixed frame member 2. In the embodiment, a right vertical frame member is the Y axis driven X axis driving frame member 4.

An X axis driving mechanism of the Y axis driven X axis driving frame member 4 comprises a second motor 14, a ball screw 15 rotated by the second motor 14 and a nut 16 attached to the frame member 4 and adapted to convert the force of rotation of the ball screw 15 into a driving force of the Y axis driven X axis driving frame member 4 in the X axis direction. The Y axis driven X axis driving frame member 4 moves in the X axis direction within a region where the Y axis driving frame member 3 extends. An amount of movement of the driving frame members 3, 4 is set in accordance with an amount of rotation of the motor 14.

Another one side section adjacent to the other side of the fixed frame member 2 is an X axis driven frame member 5 which can be driven in the X axis direction by the Y axis driven X axis driving frame member 4. This X axis driven frame member 5 does not have its own driving mechanism. The X axis driven frame member 5 moves in the X axis direction within a region where the fixed frame member 2 extends.

A window 6 is defined by the Y axis driving frame member 3, the X axis driven frame member 5, the fixed frame member 2 and the Y axis driven X axis driving frame member 4. This window 6 is enlarged or reduced by the above-mentioned Y axis movement and X axis movement of the Y axis driving frame member 3, the X axis driven frame member 5, the fixed frame member 2 and the Y axis driven X axis driving frame member 4. The four sides of the display panel P are placed and supported on the frame members defining the window 6.

Two to four of the four frame members 3, 5, 2, 4 each have a projecting stand 7 which is slenderly extended in the longitudinal direction of the respective frame members. Each stand 7 has a plurality of suction holes 8 spacedly juxtaposed in the longitudinal direction and open at a panel supporting surface. At least two side sections of the display panel P are retained under the effect of the suction holes 8 while being supported on the stands 7.

On the other hand, in the case where the supporting framework 1 is used as supporting means for supporting the probe block B, the window 6 is likewise enlarged or reduced by the above-mentioned Y axis movement and X axis movement of the Y axis driving frame member 3, the X axis driven frame member 5, the fixed frame member 2 and the Y axis driven X axis driving frame member 4. The respective frame members 3, 5, 2, 4 are not provided with the stands 7 nor the suction holes 8. Instead, they are provided with means, such as attachment holes, for threadingly attaching the probe block B. After the window 6 is enlarged or reduced by moving the respective frame members 3, 5, 2, 4 in the manner as mentioned above, the probe block B is threadingly secured to the respective frame members, 3, 5, 2,4.

The probe block B is formed by bonding a plate or sheet having a plurality of leads arranged in array to a folder block. Ends of the respective leads are projected from the folder block to form terminals 13 which are subjected to press contact with the corresponding electrode pads 12 of the display panel.

The frame members 3, 5, 2, 4 are mutually connected such that they can perform the prescribed X axis movement and/or Y axis movement through a slide rail.

More specifically, a rail 9 is disposed between the frame members 2 and 3 in such a manner as to extend in the Y axis direction along an inner side of the frame member 2, and a slider 10 slidingly engageable with the rail 9 is disposed at the frame member 3. The sliding movement of the slider 10 along the rail 9 guides the frame member 3 to move in the Y axis direction.

Similarly, a rail 9 is disposed between the frame members 3 and 4 in such a manner as to extend in the X axis direction along an inner side of the frame member 3, and a slider 10 slidingly engageable with the rail 9 is disposed at the frame member 4. The sliding movement of the slider 10 along the rail 9 guides the frame member 4 to move in the X axis direction.

Similarly, a rail 9 is disposed between the frame members 4 and 5 in such a manner as to extend in the Y axis direction along an inner side of the frame member 4, and a slider 10 slidingly engageable with the rail 9 is disposed at the frame member 5. The sliding movement of the slider 10 along the rail 9 guides the frame member 4 to move in the Y ax-is direction.

Similarly, a rail 9 is disposed between the frame members 5 and 2 in such a manner as to extend in the X axis direction along an inner side of the frame member 5, and a slider 10 slidingly engageable with the rail 9 is disposed at the frame member 2. The sliding movement of the slider 10 along the rail 9 guides the frame member 5 to move in the X axis direction.

According to a second aspect of the present invention, a square supporting framework 1 for supporting a display panel as an object to be tested or a probe block used for testing is constituted, in order to solve the above-mentioned problems, in the following manner.

A frame member constituting one side section of the square supporting framework 1 is designed to be an X axis driving frame member 2' which can drive in a direction (X axis direction) orthogonal to the one side section.

An X axis driving mechanism of the X axis driving frame member 2' comprises a first motor 14, a ball screw 15 rotated by the first motor 14 and a nut 16 attached to the frame member 2' and adapted to convert the force of rotation of the ball screw 15 into a driving force in the X axis direction of the X axis driving frame member 2'. The X axis driving frame member 2' moves in the X axis direction within a region where an X axis driven frame member 5' extends.

There is provided an X axis driven Y axis driving frame member 3' which constitutes another one side section disposed adjacent to one side of the X axis driving frame member 2', which can be driven in the X axis direction by the X axis driving frame member 2' and which can drive in a direction (Y axis direction) along the X axis driving frame member 2'.

A Y axis driving mechanism of the X axis driven Y axis driving frame member 3' comprises a second motor 14, a ball screw 15 rotated by the second motor 14 and a nut 16 attached to the frame member 3' and adapted to convert the force of rotation of the ball screw 15 into a driving force of the X axis driven Y axis driving frame member 3' in the Y axis direction. The X axis driven Y axis driving frame member 3' moves in the Y axis direction within a region where the X axis driving frame member 2' extends.

There is provided a Y axis driven X axis driving frame member 4' which constitutes another one side section disposed opposite the X axis driving frame member 2', which can be driven in the Y axis direction by the X axis driven Y axis driving frame member 3' and which can drive in the X axis direction.

An X axis driving mechanism of the Y axis driven X axis driving frame member 4' comprises a third motor 14, a ball screw 15 rotated by the third motor 14 and a nut 16 attached to the frame member 4' and adapted to convert the force of rotation of the ball screw 15 into a driving force of the Y axis driven X axis driving frame member 4' in the X axis direction. The Y axis driven X axis driving frame member 4' moves in the X axis direction within a region where the Y axis driving frame member 3' extends. An amount of movement of the driving frame members 2', 3', 4' is set in accordance with an amount of rotation of the motor 14.

There is provided an X axis driven frame member 5' which constitutes still another one side section disposed adjacent to the other side of the X axis driving frame member 2' and which can be driven in the X axis direction by the Y axis driven X axis driving frame member 4'.

A window 6 defined by the four side section frame members 3', 5', 4', 2' is enlarged or reduced by Y axis driving of the X axis driven Y axis driving frame member 3' and by X axis driving of the X axis driving frame member 2' and the Y axis driven X axis driving frame member 4'.

A probe block B to be press contacted with the display panel P or electrode pads 12 arranged on the display panel P is supported on the frame members defining the enlarged or reduced window 6.

Two to four of the four frame members 3', 5', 2', 4' each have a projecting stand 7 which is slenderly extended in the longitudinal direction of the respective frame members. Each stand 7 has a plurality of suction holes 8 spacedly juxtaposed in the longitudinal direction and open at a panel supporting surface. The four side sections of the display panel P are retained under the effect of the suction holes 8 while supporting the two to four of the frame members 3', 5', 2', 4' on the stands 7.

On the other hand, in the case where the supporting framework 1 is used as supporting means for supporting the probe block B, the respective frame members 3', 5', 2', 4' are not provided with the stands 7 nor the suction holes 8. Instead, they are provided with means, such as attachment holes 11, for threadingly attaching the probe block B. After the window 6 is enlarged or reduced by moving the respective frame members 3', 5', 2', 4' in the manner as mentioned above, the probe block B is threadingly secured to the respective frame members 3', 5', 2', 4'.

The probe block B is formed by bonding a plate or sheet having a plurality of leads arranged in array to a folder block. Ends of the respective leads are projected from the folder block to form terminals 13 which are subjected to press contact with the corresponding electrode pads 12 of the display panel.

In the same manner as previously mentioned, the frame members 3', 5', 2', 4' are mutually connected such that they can perform the prescribed X axis movement and/or Y axis movement through a slide rail.

More specifically, a rail 9 is disposed between the frame members 2' and 3' in such a manner as to extend in the Y axis direction along an inner side of the frame member 2', and a slider 10 slidingly engageable with the rail 9 is disposed at the frame member 3'. The sliding movement of the slider 10 along the rail 9 guides the frame member 3' to move in the Y axis direction.

Similarly, a rail 9 is disposed between the frame members 3' and 4' in such a manner as to extend in the Y axis direction along an inner side of the frame member 3', and a slider 10 slidingly engageable with the rail 9 is disposed at the frame member 4'. The sliding movement of the slider 10 along the rail 9 guides the frame member 4' to move in the X axis direction.

Similarly, a rail 9 is disposed between the frame members 4' and 5' in such a manner as to extend in the Y axis direction along an inner side of the frame member 4', and a slider 10 slidingly engageable with the rail 9 is disposed at the frame member 5'. The sliding movement of the slider 10 along the rail 9 guides the frame member 4' to move in the Y axis direction.

Similarly, a rail 9 is disposed between the frame members 5' and 2' in such a manner as to extend in the X axis direction along an inner side of the frame member 5', and a slider 10 slidingly engageable with the rail 9 is disposed at the frame member 2'. The sliding movement of the slider 10 along the rail 9 guides the frame member 2' to move in the X axis direction.

All of the adjacent frame members 2 to 5 and all of the adjacent frame members 2' to 5', in the first and second aspects of the present invention, are connected by way of cross-linking to each other so that they are not separated away from each other in the X axis direction or Y axis direction.

Figure 6:
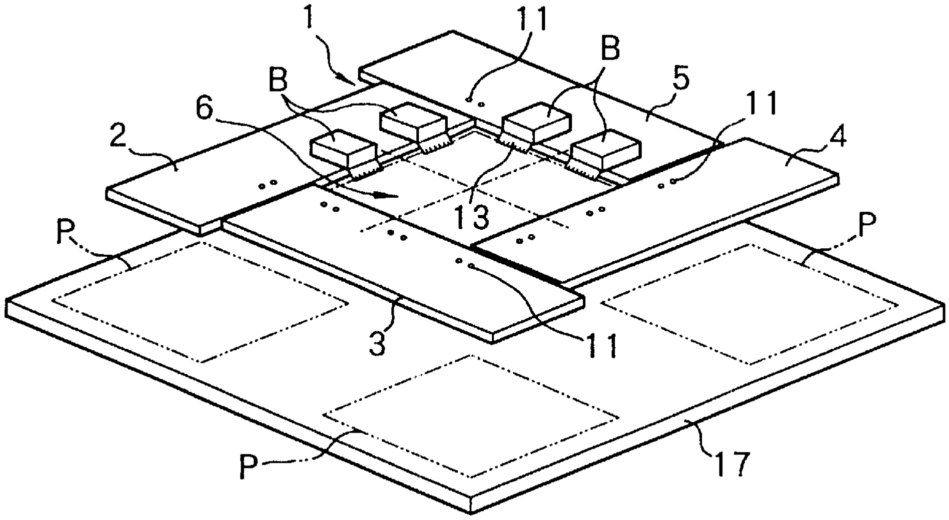
FIG. 6 is a perspective view showing a state in which plural units of display panel arranged in juxtaposed relation are tested by the probe block attached to the framework.
Figure 7:
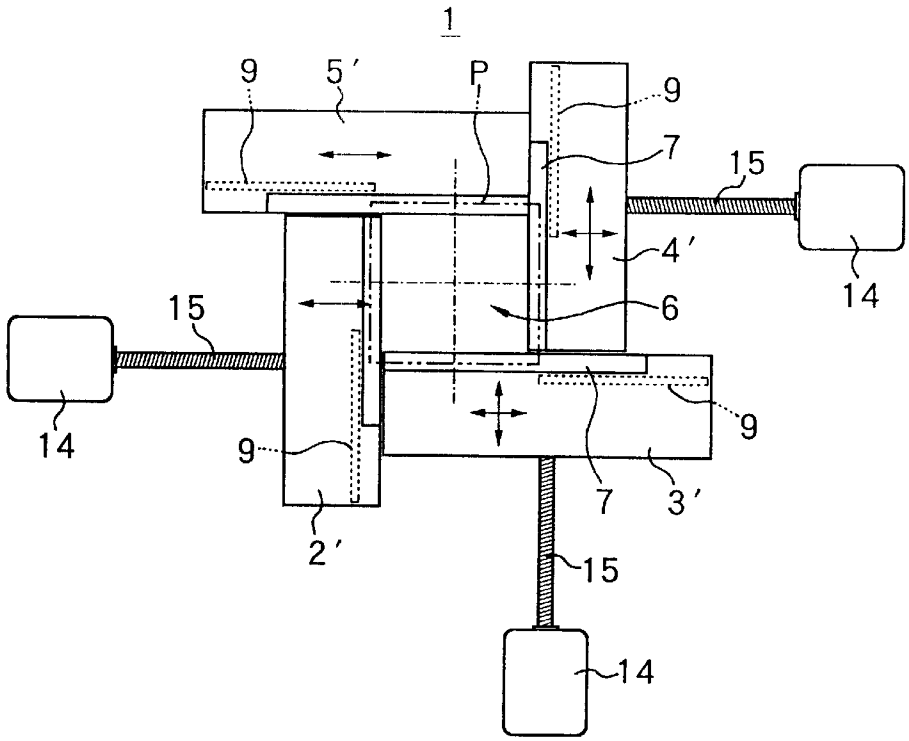
FIG. 7 is a plan view showing a reduced size position of a supporting framework for a display panel or probe block showing one embodiment of a second aspect of the present invention.
Figure 8:
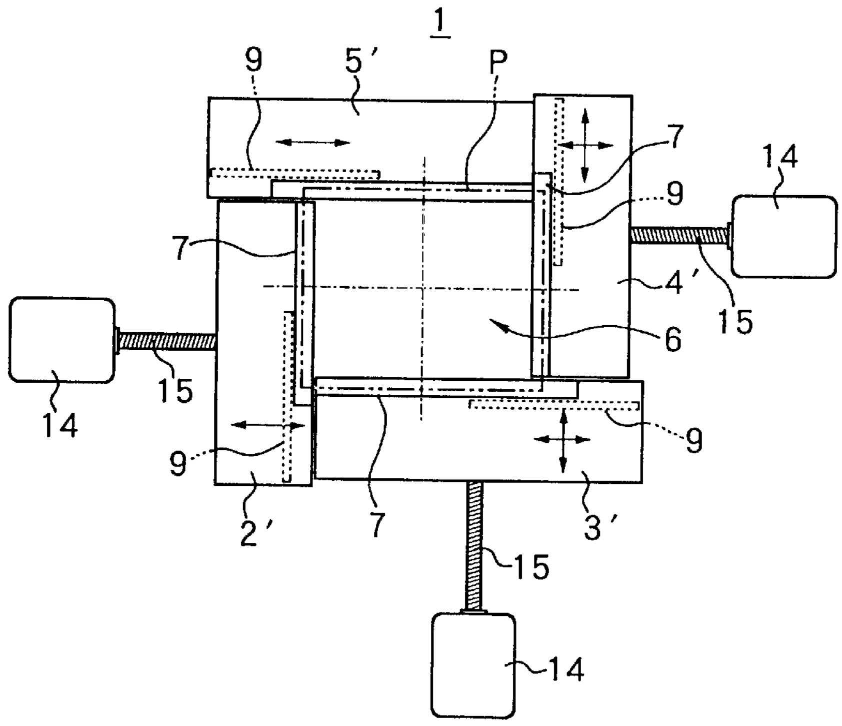
FIG. 8 is likewise a plan view showing an enlarged size position of the supporting framework with a display panel supported on it.
Figure 9:
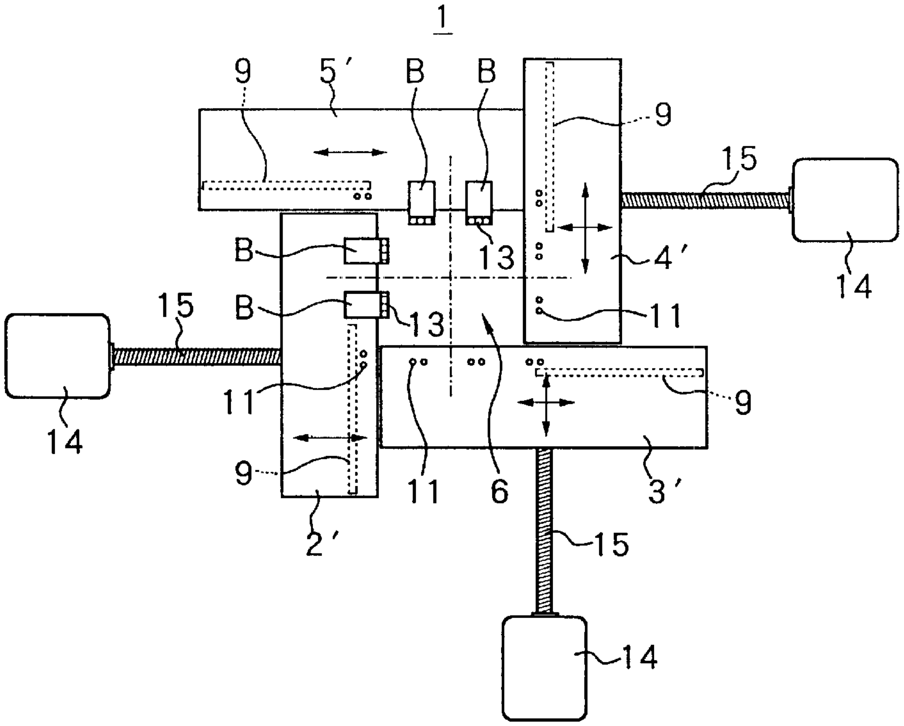
FIG. 9 is a plan view showing a reduced size position of the supporting framework but with a probe block supported on it.
Figure 10:
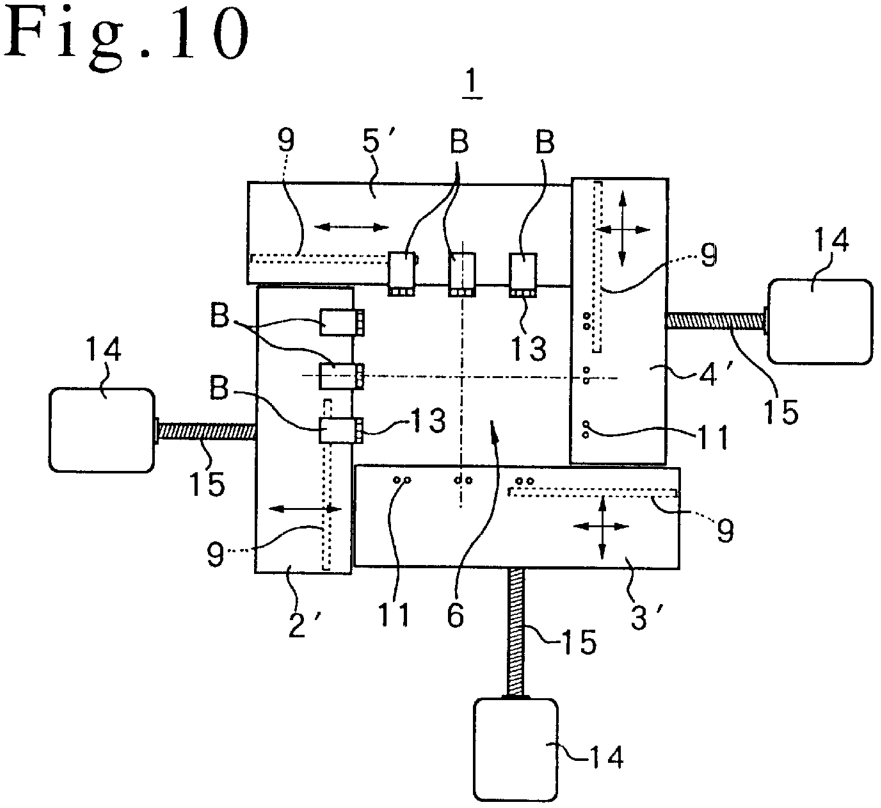
FIG. 10 is likewise a plan view showing an enlarged size position of the supporting framework but with a probe block supported on it.
Figure 11:
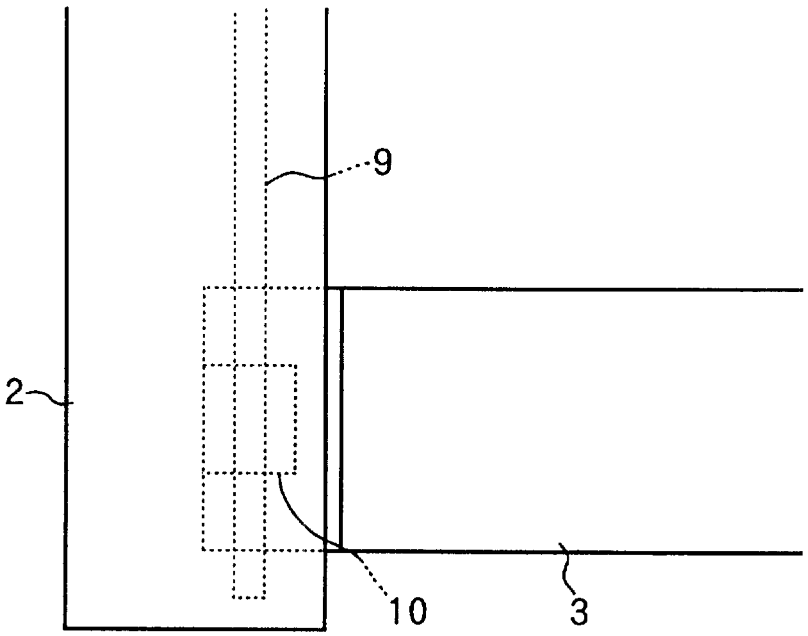
FIG. 11 is an enlarged plan view showing a connecting portion of the framework.
Figure 12:
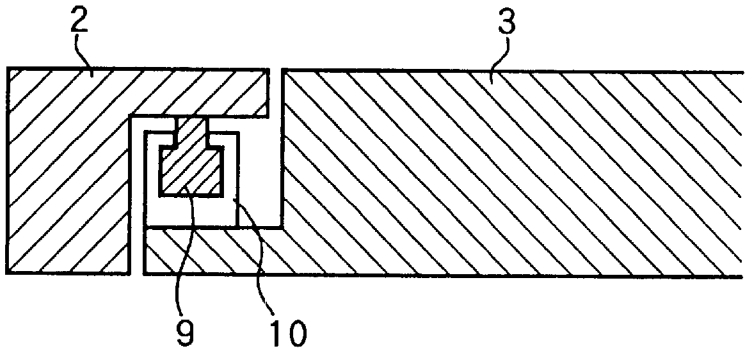
FIG. 12 is a sectional view thereof.
Figure 13:
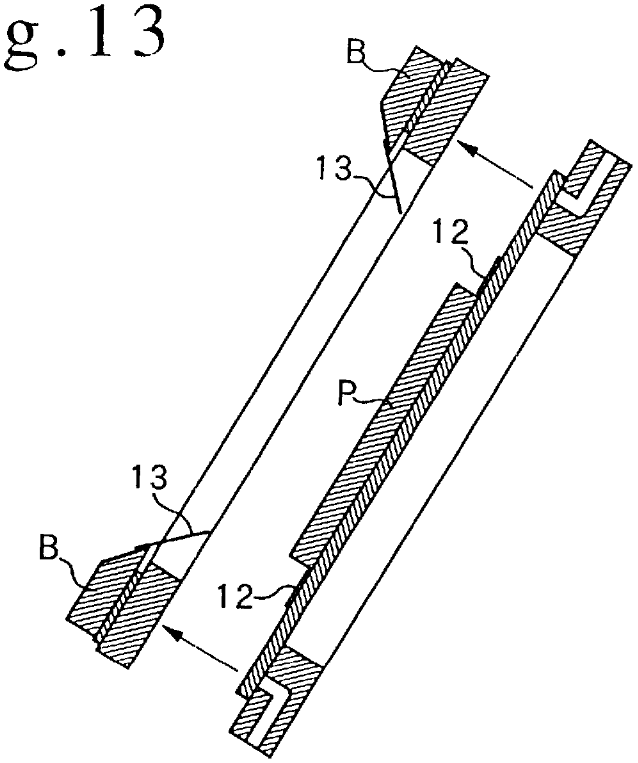
FIG. 13 is a sectional view showing a contact-released arrangement of the probe block supporting framework relative to the panel supporting framework.
Figure 14:
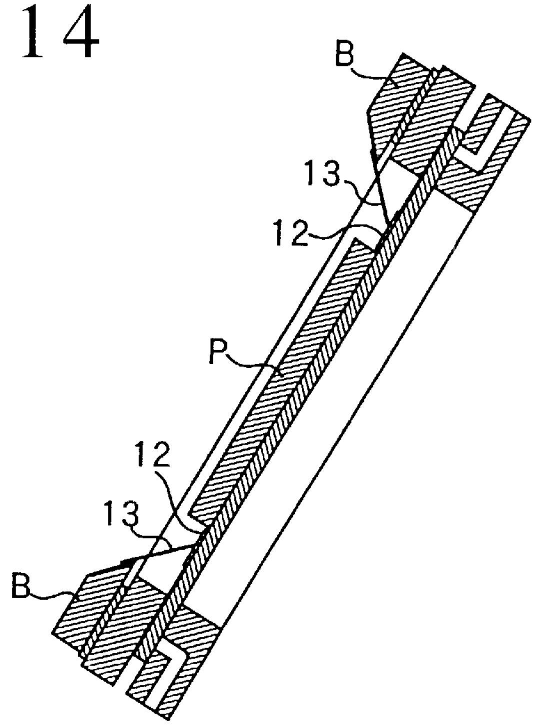
FIG. 14 is a sectional view showing a contacted arrangement of the probe block supporting framework relative to the panel supporting framework.

The procedure for testing will now be described. One or both of the supporting framework 1 with the probe block B attached thereto and the supporting framework 1 with the display panel P supported thereon by suction is designed to have the above-mentioned construction. Then, they are placed in opposing relation as shown in FIG. 13. The supporting framework 1 with the display panel P attached thereto is advanced in a direction as indicated by arrows of FIG. 13, and the electrode pads 12 of the display panel P are press contacted with the corresponding terminals 13 of the probe block B in order to carry out testing. FIG. 14 shows this state. After testing, the press contact relation is released. Thereafter, the supporting framework 1 with the probe block B attached thereto is enlarged to allow change of the display panel P. Then, the process proceeds to the next testing procedure. FIG. 6 relates to other testing apparatus and is a perspective view showing a state in which four display panels P are tested by the probe blocks B attached to the support framework 1. The supporting framework 1 with the probe blocks B attached thereto is designed in such a manner as to conform to the size of one display panel P. On the other hand, the four display panels P are arranged on an array 17 which is placed on a stage (not shown) which can move in the X axis direction (back and forth direction), Y axis direction (left and right direction) and Z axis direction (up and down direction).

At the time of testing, the supporting framework 1 with the probe blocks B attached thereto is not moved. Instead, the stage is moved in the X axis and Y axis directions to make positional alignment between a targeted display panel P and the terminals 13 of the probe blocks B. Thereafter, the display panel P is lifted upward through the stage and the electrode pads 12 of the display panel P are press contacted with the corresponding terminals 13 of the probe blocks B in order to carry out testing. After the testing for the first display panel P is finished, the stage is moved in the X axis direction and Y axis direction so that the display panel P as an object for next testing is brought towards the probe blocks B. After making positional alignment, the display panel P is lifted upward so as to carry out testing in the same manner as mentioned above.

According to the present invention, by the X axis movement and Y axis movement of the frame members, there can easily be formed a supporting framework which is dimensioned to be able to cope with various kinds of display panels each having a different size. Likewise, a testing probe block which can cope with the size of the display panel can easily be formed. By doing so, a single testing apparatus can properly cope with various kinds of display panels each having a different size. Thus, the present invention is extremely cost efficient. Moreover, the working efficiency for testing is enhanced and the testing cost is reduced.

Obviously, many modifications and variations of the present invention are possible in light of the above teachings. It is, therefore, to be understood that within the scope of the appended claims, the invention may be practiced otherwise than as specifically described.

What is claimed is:

1. A supporting framework for a display panel as an object to be tested or a probe block used for testing, said framework having a square configuration, frame members defining four side sections of said square supporting framework, comprising:

- a fixed frame member constituting one side section of said square supporting framework;
- a Y axis driving frame member constituting another one side section which is disposed adjacent to one side of said fixed frame member and which can drive in a direction (Y axis direction) along said fixed frame member;
- a Y axis driven X axis driving frame member constituting still another one side section which is disposed opposite said fixed frame member, said Y axis driven X axis driving frame member being able to be driven in a Y axis direction by said Y axis driving frame member and being able to drive in a direction (X axis direction) towards and away from said fixed frame member; and
- an X axis driven frame member constituting yet another one side section which is disposed adjacent to the other side of said fixed frame member and able to be driven in the X axis direction by said Y axis driven X axis driving frame member;
- a window defined by said four side sections being enlarged or reduced by Y axis driving of said Y axis driving frame member and by X axis driving of said Y axis driven X axis driving frame member; and
- the display panel or the probe block to be press contacted with an electrode pad arranged on the display panel can be supported on said frame members defining said enlarged or reduced window.

2. A supporting framework for a display panel as an object to be tested or a probe block used for testing, said framework having a square configuration, frame members defining four side sections of said square supporting framework, comprising:

- an X axis driving frame member constituting one side section of said square supporting framework and being able to drive in a direction (X axis direction) orthogonal to said one side section;
- an X axis driven Y axis driving frame member constituting another one side section which is disposed adjacent to one side of said X axis driving frame member and being able to be driven in an X axis direction by said X axis driving frame member and being able to drive in a direction (Y axis direction) along said X axis driving frame member;

a Y axis driven X axis driving frame member constituting still another one side section which is disposed opposite said X axis driving frame member, said Y axis driven X axis driving frame member being able to be driven in a Y axis direction by said X axis driven Y axis driving frame member and being able to drive in an X axis direction; and an X axis driven frame member constituting yet another one side section which is disposed adjacent to the other side of said X axis driving frame member and being able to be driven in the X axis direction by said Y axis driven X axis driving frame member;

a window defined by said four side sections being enlarged or reduced by Y axis driving of said X axis driven Y axis driving frame member and by X axis driving of said Y axis driving frame member and said Y axis driven X axis driving frame member; and the display panel or the probe block to be press contacted with an electrode pad arranged on said display panel can be supported on said frame members defining said enlarged or reduced window.

3. A supporting framework for a display panel or a probe block according to claim 1, wherein said respective frame members are mutually connected such that they can perform the prescribed X axis movement and/or Y axis movement through a slide rail.

4. A supporting framework for a display panel or a probe block according to claim 2, wherein said respective frame members are mutually connected such that they can perform the prescribed X axis movement and/or Y axis movement through a slide rail.

* * * * *